US008024628B2

(12) United States Patent
Do

(10) Patent No.: US 8,024,628 B2
(45) Date of Patent: Sep. 20, 2011

(54) APPARATUS AND METHOD FOR TESTING SEMICONDUCTOR MEMORY DEVICE

(75) Inventor: Chang-Ho Do, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 12/546,600

(22) Filed: Aug. 24, 2009

(65) Prior Publication Data

US 2009/0313513 A1 Dec. 17, 2009

Related U.S. Application Data

(62) Division of application No. 11/024,376, filed on Dec. 27, 2004, now Pat. No. 7,594,148.

(30) Foreign Application Priority Data

Jul. 29, 2004 (KR) ................................. 2004-59668

(51) Int. Cl.
*G11C 29/00* (2006.01)
*G11C 7/00* (2006.01)

(52) U.S. Cl. ........................................ 714/718; 365/200

(58) Field of Classification Search .................. 714/718, 714/721; 365/200–201
See application file for complete search history.

(56) References Cited

U.S. PATENT DOCUMENTS

| 5,208,778 A * | 5/1993 | Kumanoya et al. ............ 365/201 |
| 5,388,077 A * | 2/1995 | Sanada .......................... 365/201 |
| 5,463,636 A * | 10/1995 | Nakayama ....................... 714/25 |
| 5,490,115 A * | 2/1996 | Shah et al. ..................... 365/201 |
| 5,745,432 A | 4/1998 | McClure |
| 5,845,059 A | 12/1998 | McClure |
| 5,991,213 A * | 11/1999 | Cline et al. ..................... 365/201 |
| 6,490,223 B1 | 12/2002 | Han et al. |
| 6,684,356 B2 * | 1/2004 | Raad et al. ..................... 714/719 |
| 6,711,076 B2 | 3/2004 | Braceras |
| 6,868,020 B2 | 3/2005 | Aoki |
| 7,009,897 B2 * | 3/2006 | Sakemi ........................ 365/201 |

(Continued)

FOREIGN PATENT DOCUMENTS

CN 1227954 A 9/1999

(Continued)

OTHER PUBLICATIONS

Saff, D.; Ernst, M.D.; , "Reducing wasted development time via continuous testing," Software Reliability Engineering, 2003. ISSRE 2003. 14th International Symposium on , vol., No., pp. 281-292, Nov. 17-20, 2003 doi: 10.1109/ISSRE.2003.1251050.*

(Continued)

*Primary Examiner* — Cynthia Britt
(74) *Attorney, Agent, or Firm* — Blakely, Sokoloff, Taylor & Zafman

(57) ABSTRACT

A semiconductor memory device for performing a reliability test includes a write driving block for generating a predetermined test voltage in a test mode and delivering a data inputted from an external circuit into the local I/O line pair during a data access operation in a normal mode, a local I/O line pair coupled to the write driving block for receiving the predetermined test voltage in the test mode, and a cell array having a plurality of unit cells and a plurality of bit line pairs respectively having first and second bit lines and coupled to at least one unit cell for receiving the predetermined test voltage from each local I/O line pair to thereby check a result of the reliability test in the test mode.

16 Claims, 16 Drawing Sheets

U.S. PATENT DOCUMENTS

| | | |
|---|---|---|
| 2003/0031069 A1 | 2/2003 | Sakemi |
| 2003/0133350 A1 | 7/2003 | Nakao |
| 2004/0223355 A1* | 11/2004 | Hidaka .................. 365/145 |
| 2004/0246797 A1* | 12/2004 | Jeung et al. ............. 365/201 |
| 2005/0128860 A1* | 6/2005 | Hidaka .................. 365/232 |

FOREIGN PATENT DOCUMENTS

| | | |
|---|---|---|
| CN | 1232273 A | 10/1999 |
| CN | 1287362 A | 3/2001 |
| CN | 1475811 A | 2/2004 |
| CN | 1505056 | 6/2004 |
| JP | 2000-322900 | 11/2000 |

OTHER PUBLICATIONS

A current-sensed high-speed and low-power first-in-ifrst-out memory using a wordline/bitline-swapped dual-port SCRAM cell by Shibata et al. Solid-State Circuits, IEEE Journal of Publication Date: Jun. 2002 vol. 37, Issue: 6 on pp. 735-750 ISSN: 0018-9200 INSPEC Accession No. 7297338.

* cited by examiner

APPARATUS AND METHOD FOR TESTING SEMICONDUCTOR MEMORY DEVICE

The present patent application is a Divisional of application Ser. No. 11/024,376, filed Dec. 27, 2004 now U.S. Pat. No. 7,594,148.

FIELD OF INVENTION

The present invention relates to a semiconductor memory device; and, more particularly, to the semiconductor memory device having an apparatus and a method for testing a failure inside a cell array of the semiconductor memory device.

DESCRIPTION OF PRIOR ART

In the semiconductor memory device, most of failure generates at point of time when the semiconductor memory device is initially used. Generally, for detecting an initial failure which can be occurred after manufacturing the semiconductor memory device, various reliability tests such as a burn-in test that imposes a predetermined stress, e.g., severely hot or cold temperature and high operating speed, which can be inflicted during an initial operation on the semiconductor are performed. Particularly, there are usually suggested two methods for detecting the failure of the semiconductor memory device more easily and quickly: one is that a leakage between two neighboring unit cells is intentionally induced by writing two different data in the two neighboring unit cells; and the other is that a leakage between two neighboring plugs is intentionally induced by writing two different data in the two neighboring plugs.

For writing two different data in the two neighboring unit cells or plugs, a background method is generally used for reducing a test time. In the background method, two different data are not inputted and written through a data write path including an input buffer, a global I/O line, a write driver, and so on but directly written to plural unit cells.

Hereinafter, referring to FIGS. 1 to 3, a method for testing the semiconductor memory device is described by using the background method.

FIG. 1 is a block diagram showing plural cell arrays and data write paths of a conventional semiconductor memory device.

As shown, the conventional semiconductor memory device includes a plurality of segments, e.g., 100, a plurality of segment I/O lines sio0 to sio3, a plurality of local I/O lines lio0 to lio3 and a plurality of write drivers WDRV0 to WDRV3. In each segment, there are a plurality of unit cells for storing a data and a plurality of bit lines BL0 to BL5 for transmitting the data between each unit cell and the segment I/O line.

Further, the conventional semiconductor memory device includes plural first switches YISW for connecting or disconnecting the bit line to the segment I/O line; and plural second switches IOSW for connecting or disconnecting the segment I/O line to the local I/O line.

FIG. 2 is a block diagram concretely describing a data write path of the conventional semiconductor memory device shown in FIG. 1.

As shown, a write driver 200 delivers a data inputted through a first global data line GIO_W to a local I/O line lio in response to a write driver enable signal WD_EN. Then, when a second switch block IOSW is turned on, the data is transmitted to a segment I/O line sio from the local I/O line lio. A second switch block YISW controlled by a first control signal YI is for transmitting a data between a bit line, e.g., BL, and the segment I/O line sio. The data through the second switch block YISW is inputted to the segment 100 including a unit cell and a bit line sense amplifier.

Referring to FIG. 2, a data write path and a data read path of the conventional semiconductor memory device is described. Herein, general operations for writing and reading the data in the conventional semiconductor memory device are omitted.

FIG. 3 is a block diagram depicting a background method in the segment of the conventional semiconductor memory device shown in FIG. 1.

As shown, the segment 100 is described in detail. The segment 100 includes cell arrays, e.g., 20, and a sense amplifier block 60. The cell array 20 has a plurality of unit cells; and the sense amplifier block 60 also has a plurality of bit line sense amplifiers, each corresponding with each bit line pair, e.g., BL0 and BLB0.

In the background method, a test data voltage, e.g., VBLP0, instead of a bit line precharge voltage is supplied with a precharge block. During normal operation of the semiconductor memory device, the precharge block is primarily used for precharging the bit line pair, e.g., BL0 and BLB0. However, in the test mode, a predetermined test data voltage is supplied to the precharge block. Then, if some or all of a plurality of word lines are activated, the predetermined test data voltage is inputted and stored in activated unit cells. Herein, according to level of the predetermined test data voltage supplied to the precharge block, change about a voltage level supplied with each bit line is described as following table.

TABLE 1

Relationship between test data voltage and voltage level of bit line

|  | VBLP0 | VBLP1 | BL (Odd) | BL (Even) |
|---|---|---|---|---|
| CASE1 | H | H | H | H |
| CASE2 | H | L | H | L |
| CASE3 | L | H | L | H |
| CASE4 | L | L | L | L |

Referring to table 1, two predetermined test data voltage are supplied to each odd or even bit line of the segment. According to above four cases, the background method may impose a predetermined stress on two neighboring unit cell or two neighboring plugs of the semiconductor memory device in order to detect a failure or an error inside the semiconductor memory device. Also, after storing the voltage level of each bit line in each unit cell, a test for checking a read operation may be performed by simultaneously outputting all data stored in all unit cells.

However, according to the background method above described, the semiconductor memory device should include a test voltage generator for generating two predetermined test data voltages; and a complex voltage supplier for supplying each precharge block with the two predetermined test data voltages in response to each even or odd bit line. For example, plural power lines and pads for supplying a predetermined test data voltage to the precharge block should be added in the segment of the semiconductor memory device.

Also, in the conventional semiconductor memory device, a bit line pair, i.e., BL and BLB, is always supplied with the same voltage level during the background method and, thus, there is some limitation about a test method for detecting a failure of the semiconductor memory device in various ways.

Generally, the conventional semiconductor memory device is constituted with a core area and a peripheral area.

That is, there are plural cell arrays and sense amplifiers in the core area; and plural apparatuses relating to data and address input and output are located in the peripheral area. Also, plural wire and additional blocks for supplying a power and testing the semiconductor memory device are generally implemented in the peripheral area. However, in the semiconductor memory device for performing a test by the background method as above described, plural additional wires for supplying the test data voltage should be equipped to the precharge blocks in the core area. Thus, the plural additional wires cause a trouble of a manufacturing process and an increase of a manufacturing cost and time.

SUMMARY OF INVENTION

It is, therefore, an object of the present invention to provide a semiconductor memory device, which can perform various reliability tests, made by a simplified manufacturing method and a moderate manufacturing cost.

It is, therefore, another object of the present invention to provide a semiconductor memory device having additional modules and wires in its peripheral area in order to perform a reliability test.

It is, therefore, another object of the present invention to provide a semiconductor memory device which can be supplied with predetermined test voltages in various patterns for a reliability test.

It is, therefore, another object of the present invention to provide a semiconductor memory device of which first and second bit lines consisting of a bit line pair can be respectively supplied with different test voltages during a reliability test.

In accordance with an aspect of the present invention, there is provided a semiconductor memory device for performing a reliability test, including: a write driving block for generating a predetermined test voltage in a test mode and delivering a data inputted from an external circuit into the local I/O line pair during a data access operation in a normal mode, a local I/O line pair coupled to the write driving block for receiving the predetermined test voltage in the test mode, and a cell array having a plurality of unit cells and a plurality of bit line pairs respectively having first and second bit lines and coupled to at least one unit cell for receiving the predetermined test voltage from each local I/O line pair to thereby check a result of the reliability test in the test mode.

In accordance with another aspect of the present invention, there is provided a semiconductor memory device for performing a reliability test, including: a test voltage generating block for generating a predetermined test voltage during a test mode, a local I/O line pair coupled to the test voltage generating block for receiving the predetermined test voltage in the test mode, and a cell array having a plurality of unit cells and a plurality of bit line pairs respectively having first and second bit lines and coupled to at least one unit cell for receiving the predetermined test voltage from each local I/O line pair to thereby check a result of the reliability test in the test mode.

In accordance with another aspect of the present invention, there is provided a semiconductor memory device for performing a reliability test, including: a local I/O line precharging block for generating a predetermined test voltage during a test mode and generating a core voltage as a local I/O line precharge voltage during a normal mode, a local I/O line pair coupled to the local I/O line precharging block for receiving the predetermined test voltage in the test mode, and a cell array having a plurality of unit cells and a plurality of bit line pairs respectively having first and second bit lines and coupled to at least one unit cell for receiving the predetermined test voltage from each local I/O line pair to thereby check a result of the reliability test in the test mode.

In accordance with another aspect of the present invention, there is provided a method for performing a background write test in the semiconductor memory device, including the steps of: a) generating at least one test command signal, b) preparing a test path for transmitting an predetermined test voltage outputted in response to the test command signal into a unit cell, c) supplying the predetermined test voltage to a local I/O line pair, and d) reading a stored data of the unit cell in order to conform a result of the background write test.

In accordance with another aspect of the present invention, there is provided a semiconductor memory device for performing a background test, including: a test decision block for determining a goal and a range of the background write test and generating at least one test control signal; a test voltage generating block for outputting at least one predetermined test voltage to each data line in response to the test control signal outputted from the test decision block; and a test performing block coupled to the test voltage generating block through each data line for receiving the predetermined test voltage to check a fault of each data path and each unit cell.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device for performing various reliability tests according to the present invention will be described in detail referring to the accompanying drawings.

Figure 1:
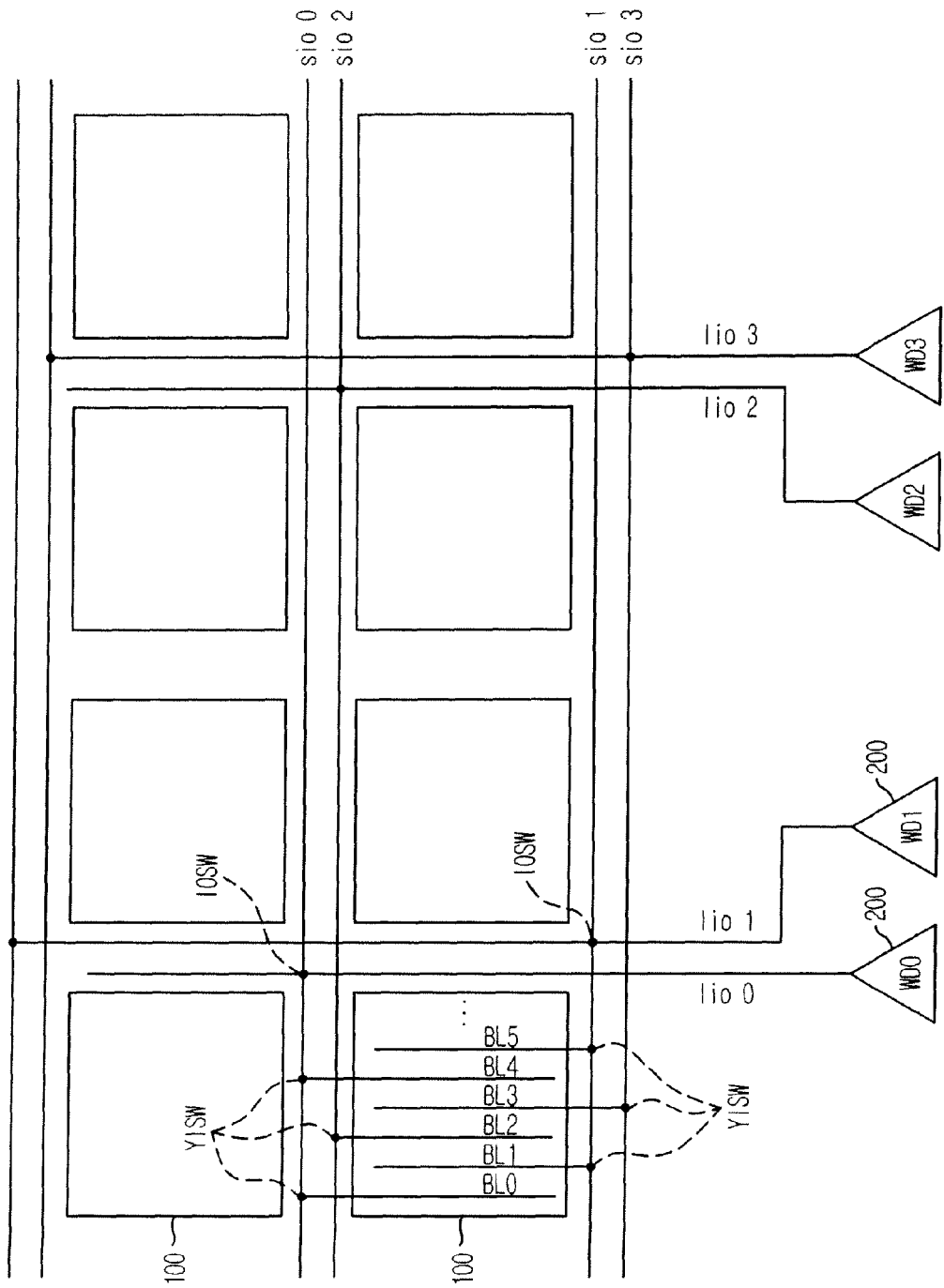
FIG. 1 is a block diagram showing plural cell arrays and data write paths of a conventional semiconductor memory device.
Figure 2:
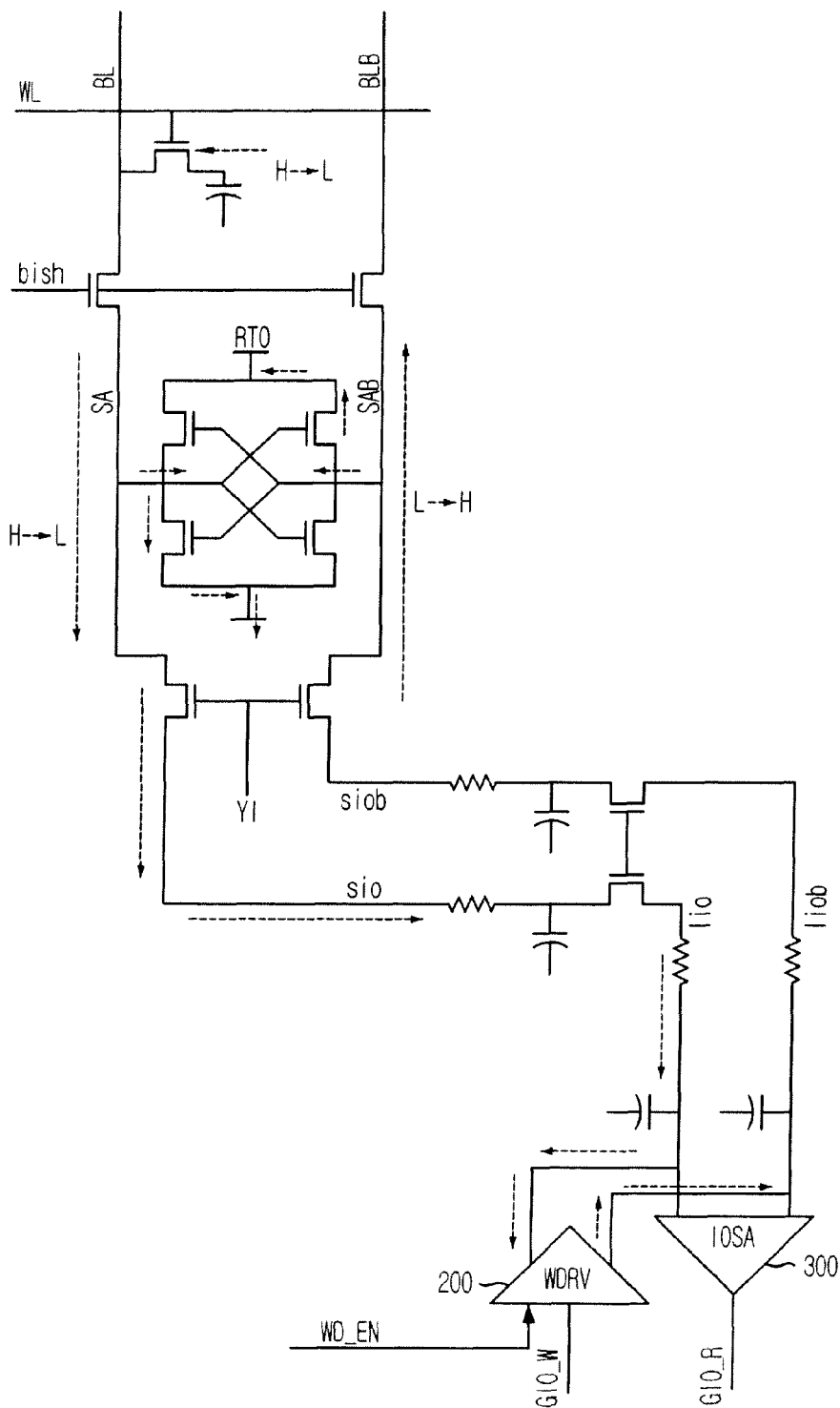
FIG. 2 is a block diagram concretely describing a data write path of the conventional semiconductor memory device shown in FIG. 1.
Figure 3:
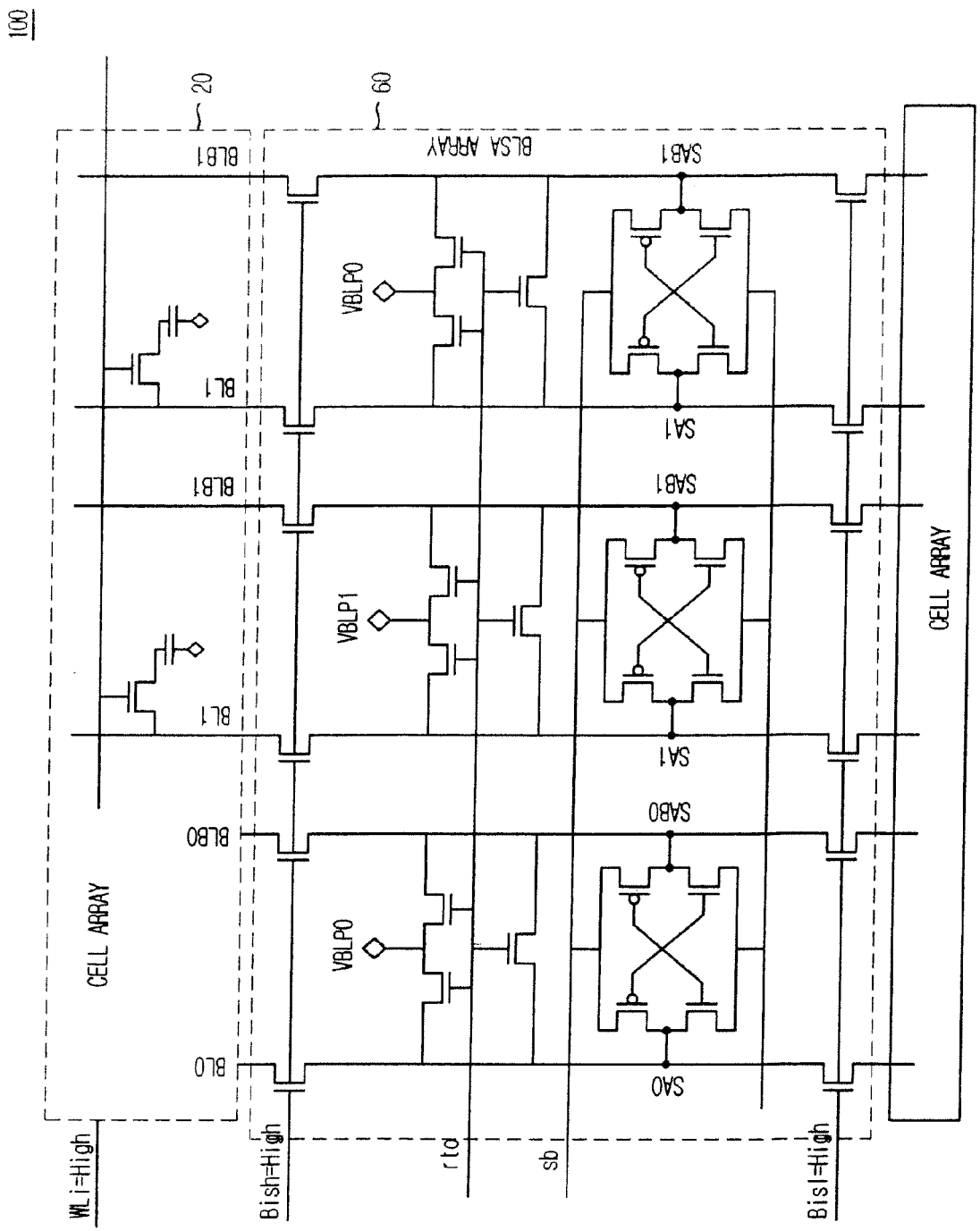
FIG. 3 is a block diagram depicting a background method in a segment of the conventional semiconductor memory device shown in FIG. 1.
Figure 4:
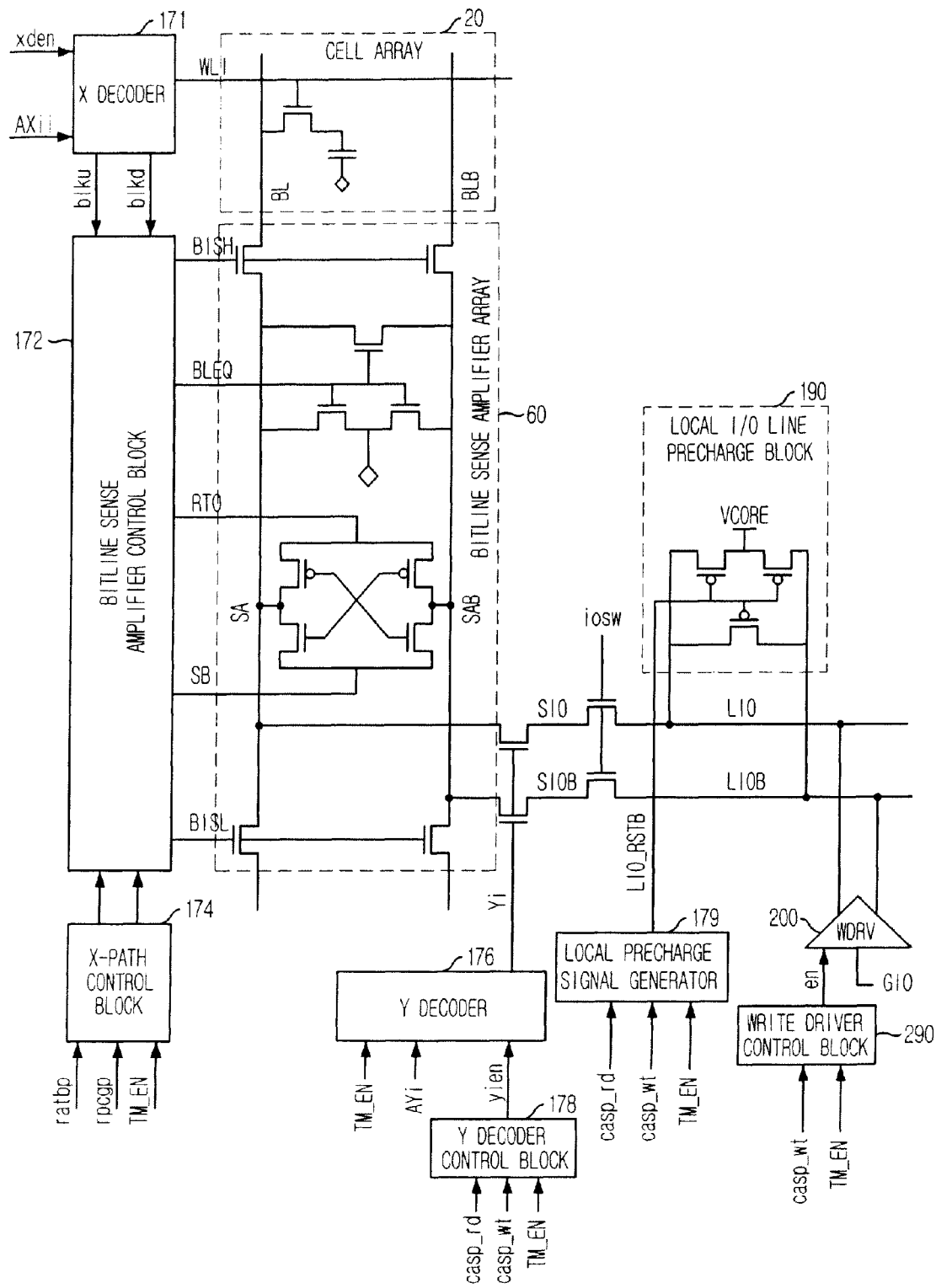
FIG. 4 is a block diagram showing a semiconductor memory device in accordance with a first embodiment of the present invention.

FIG. 4 is a block diagram showing a semiconductor memory device in accordance with a first embodiment of the present invention.

As shown, the semiconductor memory device includes a cell array 20, a bit line sense amplifier array 60, a bit line sense amplifier control block 172, an X decoder 171, an Y decoder 176, a X-path control block 174, a Y decoder control block 178, a local I/O line precharge block 190, a local precharge signal generator 179, a write driver 200, a write driver control block 290.

The cell array 20 includes a plurality of unit cells, each constituted with one transistor and one capacitor. A plurality of word lines coupled to each unit cell are controlled by the X decoder 171.

The bit line sense amplifier array 60 controlled by the bit line sense amplifier control block 172 includes a sense amplifier, a precharge unit, an equalizer and a connection control unit. The sense amplifier controlled by a first amplifying voltage RTO and a second amplifying voltage SB outputted to the bit line sense amplifier control block 172 is for sensing and amplifying a voltage difference between a bit line BL and a bit line bar BLB. The precharge unit having two transistor precharges the bit line BL and the bit line bar BLB as a precharge voltage and the equalizer is for making each voltage level of the bit line BL and the bit line bar BLB be same. Herein, the bit line sense amplifier array 60 includes a first and a second connection control blocks respectively controlled by a first and a second connection control signals BISH and BISL outputted from the bit line sense amplifier control block 172. That is, it means that the bit line sense amplifier array 60 is coupled to two neighboring cell arrays.

Further, the bit line sense amplifier control block 172 is controlled by the X decoder 171 and the X-path control block 174. The Y decoder 176 generates a column control signal Yi for connecting or disconnecting each bit line pair constituted with the bit line BL and the bit line bar BLB to each local I/O line pair constituted with a segment line SIO and a segment line bar SIOB. The Y decoder 176 is controlled by the Y decoder control block 178.

Herein, the X decoder 171, the Y decoder 176, the X-path control block 174 and the Y decoder control block 178 are controlled by plural instructions based on an inputted address and an inputted command in a normal mode, e.g., a data access operation. However, in a test mode, the Y decoder 176, the X-path control block 174 and Y decoder control block 178 are controlled by a test mode enable signal TM_EN.

The local precharge signal generator 179 outputs a local I/O line precharge signal LIO_RSTB to the local I/O line precharge block 190. The local I/O line precharge block 190 precharges the local I/O line pair, i.e., the local I/O line LIO and the local I/O line bar LIOB, in response to the local I/O line precharge signal LIO_RSTB. Also, the write driver control block 290 outputs a write enable signal en to the write driver 200. Then, in response to the write enable signal en, the write driver 200 delivers a data inputted from an external circuit into the local I/O line pair LIO and LIOB in the normal mode.

Herein, the local precharge signal generator 179 and the write driver control block 290 are controlled by plural instructions based on the inputted address and the inputted command in the normal mode. However, in a test mode, the local precharge signal generator 179 and the write driver control block 290 are controlled by a test mode enable signal TM_EN.

Particularly, in the semiconductor memory device according to the first embodiment of the present invention, the write driver 200 outputs a predetermined test voltage in the test mode.

Hereinafter, how to transmit the predetermined test voltage in the semiconductor memory device during the test mode is described in detail.

A plurality of bit line pairs, e.g., BL and BLB, are coupled to the segment I/O line pair SIO and SIOB and a plurality of segment I/O lines, e.g., SIO and SIOB are coupled to the local I/O line pair LIO and LIOB, i.e., a first local I/O line and a second local I/O line.

There are two switching blocks: a first one is for connecting or disconnecting the bit line pair to the segment I/O line pair in response to the column control signal Yi and a second one is for connecting or disconnecting the segment I/O line pair to the local I/O line pair in response to a data I/O control signal iosw.

The predetermined test voltage is generated by the write driver 200 and supplied to the local line pair LIO and LIOB. Then, through the second switching block, the predetermined test voltage is transmitted to the segment I/O line pair SIO and SIOB. After then, through the first switching block, the predetermined test voltage is supplied to the bit line pair BL and BLB in response to the column control signal Yi.

Figure 5:
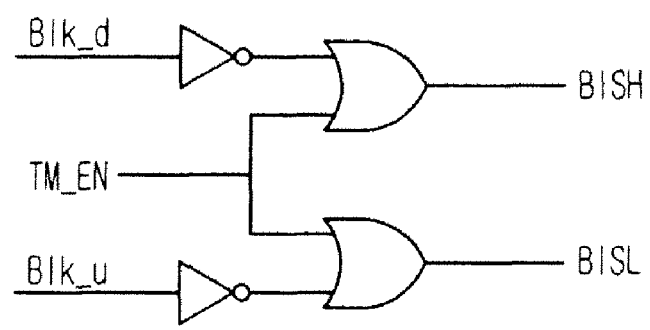
FIG. 5 is a circuit diagram describing a partial circuit of a bit line sense amplifier control block shown in FIG. 4.

FIG. 5 is a circuit diagram describing a partial circuit of a bit line sense amplifier control block shown in FIG. 4.

As shown, the bit line sense amplifier control block 172 includes two inverters and two OR gates. The first connection control signal BISH is a result of the logic OR operation between the test mode enable signal TM_EN and an output signal of a first inverter. The first inverter is for inverting an inputted signal Blk_d outputted from the X decoder 171. Likewise, the second connection control signal BISL is a result of the logic OR operation between the test mode enable signal TM_EN and an output signal of a second inverter. The second inverter is for inverting another inputted signal Blk_u outputted from the X decoder 171. Herein, the inputted signals Blk_d and Blk_u is based on the inputted address and the inputted command for controlling a connection between one of two neighbor cell arrays and the sense amplifier.

Figure 6:
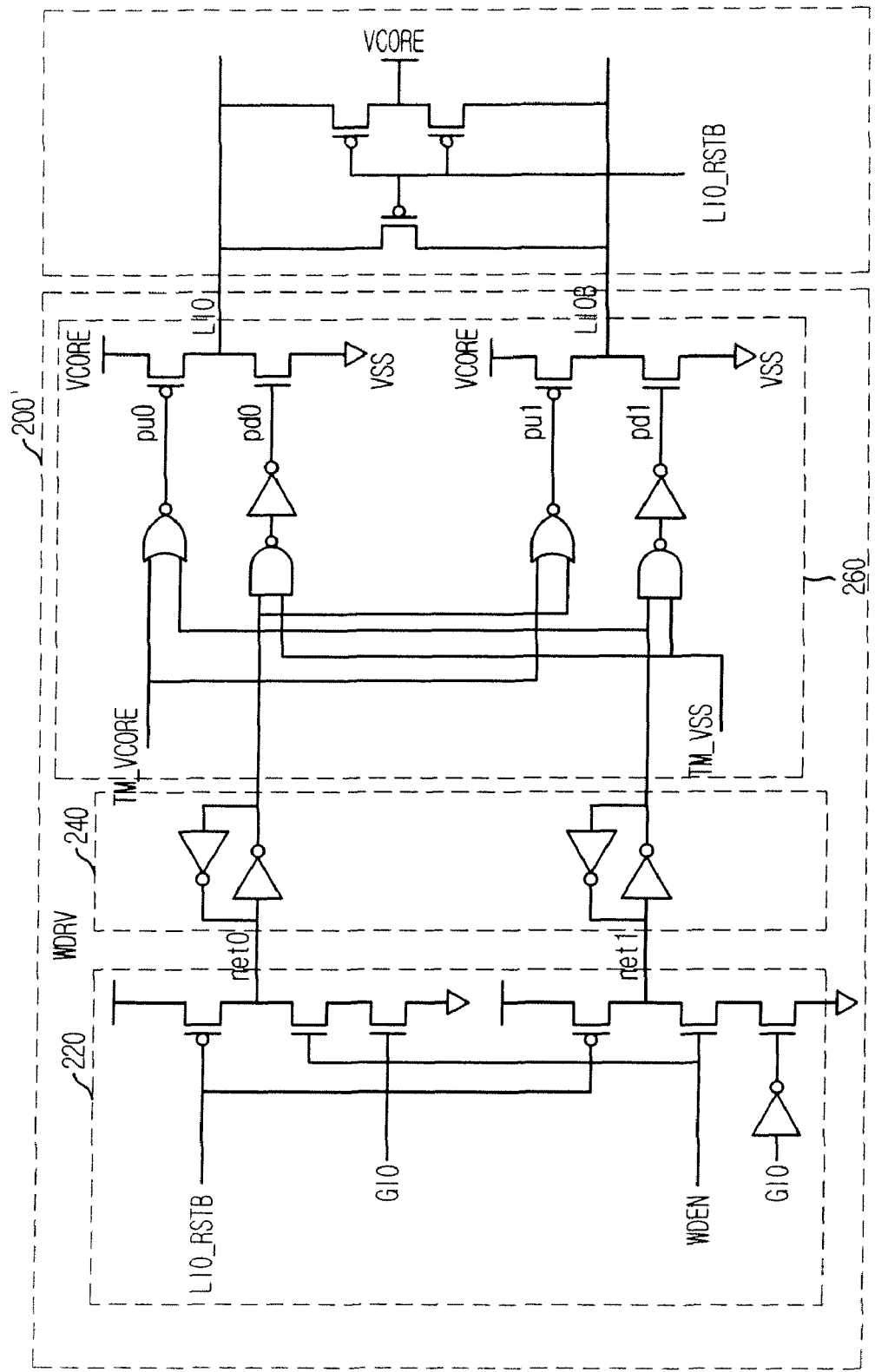
FIG. 6 is a circuit diagram describing an exemplary embodiment of a write driver shown in FIG. 4.

FIG. 6 is a circuit diagram describing an exemplary embodiment of the write driver shown in FIG. 4.

As shown, a write driver 200' includes a data receiving block 220, a latching block 240 and a test voltage generating block 260.

The data receiving block 220 is for receiving the inputted data signal through a global I/O line GIO, a precharge command signal LIO_RSTB and a write enable signal WDEN and generating first and second output signals net0 and net1. The latching block 240 receives and latches the first and second output signals net0 and net1 respectively to output an inverse first output signal and an inverse second output signal.

The test voltage generating block 260 is for receiving the inverse first output signal, the inverse second output signal and first and second test mode signals TM_VCORE and TM_VSS to thereby output one of the inputted data signal and the predetermined test voltage to each local I/O line pair LIO and LIOB in response to the first and second test mode signals TM_VCORE and TM_VSS.

Further, the local I/O line pair LIO and LIOB is coupled to the local I/O line precharge block constituted with three PMOS transistors. In addition, the write enable signal WDEN is activated in response to a write command signal and a test command signal which are inputted from the outside of the semiconductor memory device.

In detail, the data receiving block 220 includes a first MOS transistor controlled by a precharge command signal LIO_RSTB for outputting a core voltage VCORE as the first output signal net0, a second MOS transistor controlled by the inputted data signal through a global I/O line GIO for transmitting a ground VSS, a third MOS transistor controlled by the write enable signal WDEN for outputting the ground transmitted from the second MOS transistor as the first output signal net0, a fourth MOS transistor controlled by the precharge command signal LIO_RSTB for outputting a core voltage VCORE as the second output signal net1, a first inverter for inverting the inputted data signal, a fifth MOS transistor controlled by an inverse inputted data signal through a global I/O line GIO for transmitting the ground VSS, and a sixth MOS transistor controlled by the write enable signal WDEN for outputting the ground VSS transmitted from the second MOS transistor as the second output signal net1.

Next, the latching block 240 includes a first latching unit constituted with two circularly connected inverters for latching the first output signal net0 and outputting an inverse first output signal to the test voltage generating block 260 and a second latching unit constituted with two circularly connected inverters for latching the second output signal net1 and outputting an inverse second output signal to the test voltage generating block 260.

The test voltage generating block 260 includes a first NOR gate for receiving the first test mode signal TM_CORE and the inverse second output signal and generating a first pull-up signal pu0 according to a result of a logic NOR operation about the first test mode signal TM_VCORE and the inverse second output signal, a second NOR gate for receiving the second test mode signal TM_VSS and the inverse first output signal and outputting a first resultant signal of a logic NOR operation about the first test mode signal TM_VCORE and the inverse second output signal, a third inverter for inverting the first resultant signal to thereby generate as a first pull-down signal pu0, a third NOR gate for receiving the first test mode signal TM_VCORE and the inverse first output signal and generating a second pull-up signal pu1 according to a result of a logic NOR operation about the first test mode signal TM_VCORE and the inverse first output signal, a fourth NOR gate for receiving the second test mode signal TM_VSS and the inverse second output signal and outputting a second resultant signal of a logic NOR operation about the first test mode signal TM_VCORE and the inverse second output signal, a third inverter for inverting the second resultant signal to thereby generate as a second pull-down signal pd1; a seventh MOS transistor controlled by the first pull-up signal pu0 for supplying the second local I/O line LIO with a core voltage VCORE as one of the inputted data signal and the predetermined test voltage, a eighth MOS transistor controlled by the first pull-down signal pd0 for supplying the first local I/O line LIO with a ground VSS as one of the inputted data signal and the predetermined test voltage, a ninth MOS transistor controlled by the second pull-up signal pu1 for supplying the second local I/O line LIOB with a core voltage VCORE as one of the inputted data signal and the predetermined test voltage, and a tenth MOS transistor controlled by the second pull-down signal pd1 for supplying the second local I/O line LIOB with a ground VSS as one of the inputted data signal and the predetermined test voltage.

Herein, the first test mode signal TM_VCORE is for supplying a logic high level voltage to a unit cell of the cell array and the second test mode signal TM_VSS is for supplying a logic low level voltage to the unit cell of the cell array.

During the normal mode, if the inverse first output signal outputted from the first latching block is a logic high level and the inverse second output signal outputted from the second latching block is a logic low level, the write driver 200 outputs a logic low level voltage to the first local I/O line LIO and a logic high level voltage to the second local I/O line LIOB. If the precharge command signal LIO_RSTB is activated, the first and the second local I/O lines LIO and LIOB is floated.

In the test mode, if the first test mode signal TM_VCORE is a logic high level, the first and the second local I/O lines LIO and LIOB become a logic high level; and if second test mode signal TM_VSS is a logic high level, the first and the second local I/O lines LIO and LIOB become a logic low level.

Figure 7:
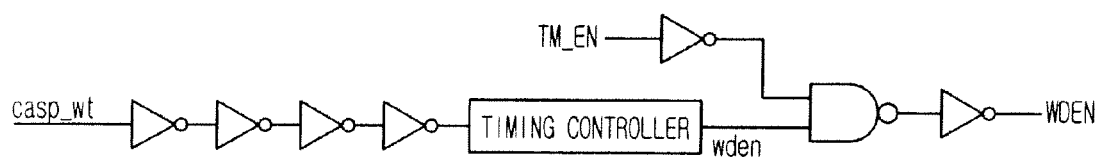
FIG. 7 is a circuit diagram describing a write driver control block shown in FIG. 4.

FIG. 7 is a circuit diagram describing the write driver control block 290 shown in FIG. 4.

As shown, the write driver control block 290 includes a plurality of inverters, a timing controller and a NAND gate. In the conventional memory device, the write driver control block is for delaying a write instruction casp_wt by a predetermined time to thereby generates a write enable signal. However, in the present invention, since the write driver 200 is operated in response to the test mode enable signal TM_EN, plural logic gates are added in the write driver control block 290 for generating the write enable signal WDEN in response to the test mode enable signal TM_EN.

Figure 8A:
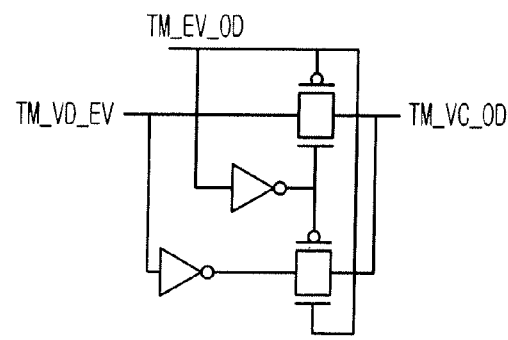
FIGS. 8A and 8B are circuit diagrams depicting a first test decision block for controlling the semiconductor memory device shown in FIG. 4.
Figure 8B:
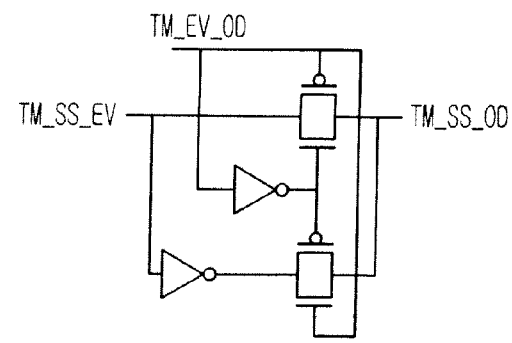

FIGS. 8A and 8B are circuit diagrams depicting a first test decision block for controlling the semiconductor memory device shown in FIG. 4. In detail, FIG. 8A is a circuit diagram depicting a first block of a first test decision block for controlling the semiconductor memory device shown in FIG. 4; and FIG. 8B is a circuit diagram depicting a second block of the first test decision block for controlling the semiconductor memory device shown in FIG. 4. Referring to FIGS. 8A and 8B, each block includes two inverters and two transmission gates.

Herein, the semiconductor memory device includes plural write drivers and plural bit line pairs. Referring to following tables, the test is performed in a basis of even and odd times of the bit line pairs by using plural test control signals. Herein, the signal TM_VD_EV corresponding to even number bit line pairs is for supplying a logic high level voltage to the even number bit line pairs, i.e., BL even and BLB even. The signal TM_SS_EV corresponding to even number bit line pairs is for supplying a logic low level voltage to the even number bit line pairs, i.e., BL even and BLB even. The signal TM_VD_OD corresponding to odd number bit line pairs is for supplying a logic high level voltage to the odd number bit line pairs, i.e., BL odd and BLB odd. The signal TM_VD_OD corresponding to odd number bit line pairs is for supplying a logic low level voltage to the odd number bit line pairs, i.e., BL odd and BLB odd.

TABLE 2

Logic levels of bit line pairs in response to plural test control signals

| | BL even | BLB even | BL odd | BLB odd | TM_VD_EV | TM_SS_EV | TM_VD_OD | TM_SS_OD |
|---|---|---|---|---|---|---|---|---|
| CASE1 | H | H | X | X | H | L | L | L |
| CASE2 | X | X | H | H | L | L | H | H |
| CASE3 | L | L | X | X | L | H | L | L |
| CASE4 | X | X | H | H | L | L | H | L |

Herein, if the signals TM_VD_OD and TM_SS_OD are logic low levels, odd number bit line pairs are null. Also, though not shown in table 2, there are a lot of cases during the test performed in the semiconductor memory device according to the present invention.

In addition, the plural control signal can be reduced. For example, by using the signal TM_EV_OD, the signal TM_VD_OD is generated from the signal TM_VD_EV. That is, using the signal TM_EV_OD, the number of inputted test control signals is reduced. In the following table, the signals TM_EV_OD, TM_VD_EV and TM_SS_EV are inputted and the signals TM_VD_OD and TM_SS_OD are generated from the first and the second blocks shown in FIGS. 8A and 8B.

TABLE 3

Logic levels of bit line pairs in response to plural test control signals

| | BL even | BLB even | BL odd | BLB odd | TM_VD_EV | TM_SS_EV | TM_VD_OD | TM_SS_OD | TM_EV_OD |
|---|---|---|---|---|---|---|---|---|---|
| CASE1 | H | H | H | H | H | L | H | L | L |
| CASE2 | L | L | L | L | L | H | L | H | L |
| CASE3 | H | H | L | L | H | L | L | H | H |
| CASE4 | L | L | H | H | L | H | H | L | H |

Figure 9:
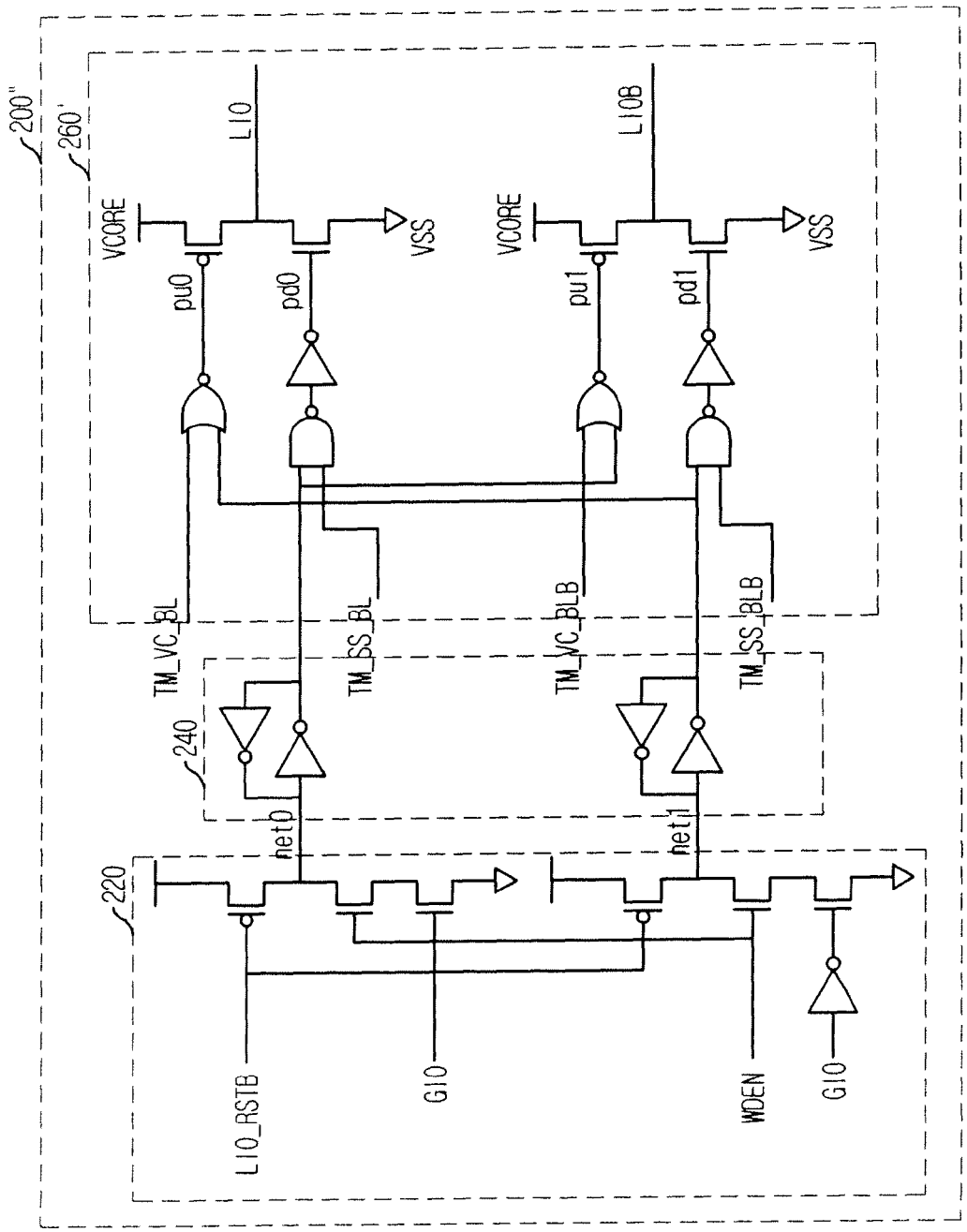
FIG. 9 is a circuit diagram describing another exemplary embodiment of the write driver shown in FIG. 4.
Figure 10A:
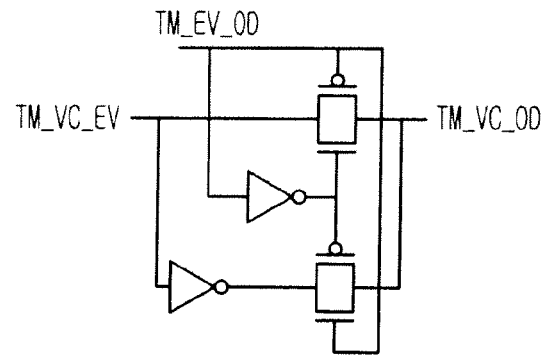
FIGS. 10A to 10D are circuit diagrams depicting a second test decision block for controlling the semiconductor memory device shown in FIG. 4.
Figure 10B:
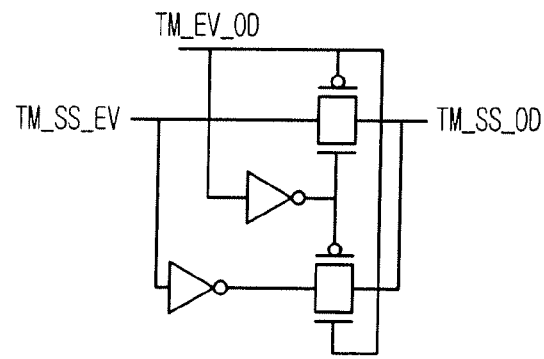
Figure 10C:
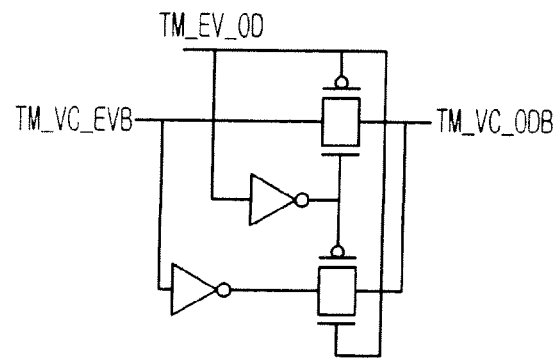
Figure 10D:
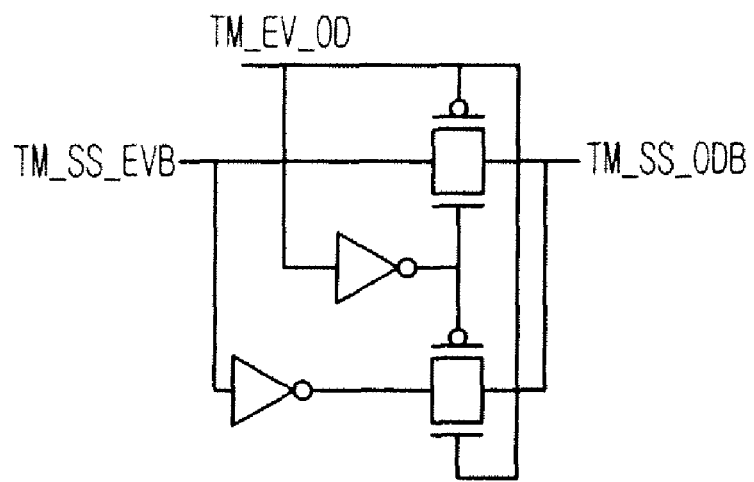

FIG. 9 is a circuit diagram describing another exemplary embodiment of the write driver shown in FIG. 4.

As shown, the write driver 200″ includes the data receiving block 220, the latching block 240 and a test voltage generating block 260.

Herein, the data receiving block 220 and the latching block 240 is the same to those described in FIG. 6. Thus, detailed description about the data receiving block 220 and the latching block 240 is omitted.

The test voltage generating block 260 is for receiving the inverse first output signal, the inverse second output signal, a first test mode signal TM_VC_BL, a second test mode signal TM_SS_BL, a third test mode signal TM_VC_BLB and a fourth test mode signal TM_SS_BLB to thereby output one of the inputted data signal and the predetermined test voltage to each local I/O line pair LIO and LIOB in response to the first to fourth test mode signals.

In detail, the test voltage generating block 260 includes a first NOR gate for receiving the first test mode signal TM_VC_BL and the inverse second output signal and generating a first pull-up signal pu0 according to a result of a logic NOR operation about the first test mode signal TM_VC_BL and the inverse second output signal, a second NOR gate for receiving the second test mode signal TM_SS_BL and the inverse first output signal and outputting a first resultant signal of a logic NOR operation about the second test mode signal TM_SS_BL and the inverse first output signal, a third inverter for inverting the first resultant signal to thereby generate as a first pull-down signal pd0, a third NOR gate for receiving the third test mode signal TM_VC_BLB and the inverse first output signal and generating a second pull-up signal pu1 according to a result of a logic NOR operation about the first test mode signal and the inverse first output signal, a fourth NOR gate for receiving the fourth test mode signal TM_SS_BLB and the inverse second output signal and outputting a second resultant signal of a logic NOR operation about the fourth test mode signal TM_SS_BLB and the inverse second output signal, a third inverter for inverting the second resultant signal to thereby generate as a second pull-down signal pd1, a seventh MOS transistor controlled by the first pull-up signal pu0 for supplying the first local I/O line with a core voltage as one of the inputted data signal and the predetermined test voltage, a eighth MOS transistor controlled by the first pull-down signal pd0 for supplying the first local I/O line LIO with a ground as one of the inputted data signal and the predetermined test voltage, a ninth MOS transistor controlled by the second pull-up signal pu1 for supplying the second local I/O line LIOB with a core voltage as one of the inputted data signal and the predetermined test voltage, and a tenth MOS transistor controlled by the second pull-down signal pd1 for supplying the second local I/O line LIOB with a ground as one of the inputted data signal and the predetermined test voltage.

As compared with FIG. 6, the write driver shown in FIG. 9 can perform a test having more cases by using the first to fourth test mode signals. Particularly, the write driver shown in FIG. 9 can supply two different logic level voltages to the first and the second local I/O lines.

FIGS. 10A to 10D are circuit diagrams depicting a second test decision block for controlling the semiconductor memory device shown in FIG. 4.

As shown, the second test decision block includes a first to a fourth blocks, each constituted with two inverters and two transmission gates. Each block is the same to the first and second blocks respectively shown in FIGS. 8A and 8B in their structures.

Referring to following tables, the test is performed in a basis of even and odd times of the bit line pairs by using plural test control signals.

TABLE 4

Logic levels of bit line pairs in response to plural test control signals

| | BL even | BLB even | BL odd | BLB odd | TM_VD_EV | TM_SS_EV | TM_VD_EVB | TM_SS_EVB |
|---|---|---|---|---|---|---|---|---|
| CASE1 | L | L | L | L | L | H | L | H |
| CASE2 | L | H | L | H | L | H | H | L |
| CASE3 | H | L | H | L | H | L | L | H |
| CASE4 | H | H | H | H | H | L | H | L |
| CASE5 | L | L | H | H | L | H | L | H |
| CASE6 | L | H | H | L | L | H | H | L |
| CASE7 | H | L | L | H | H | L | L | H |
| CASE8 | H | H | L | L | H | L | H | L |

| | TM_VD_OD | TM_SS_OD | TM_VD_ODB | TM_SS_ODB | TM_EV_OD |
|---|---|---|---|---|---|
| CASE1 | L | H | L | H | L |
| CASE2 | L | H | H | L | L |
| CASE3 | H | L | L | H | L |
| CASE4 | H | L | H | L | L |
| CASE5 | H | L | H | L | H |
| CASE6 | H | L | L | H | H |
| CASE7 | L | H | H | L | H |
| CASE8 | L | H | L | H | H |

Herein, if the signals TM_VC_EV and TM_VC_OD are similar to the signals TM_VD_EV and TM_VD_OD shown in tables 2 and 3. Further, the signal TM_VC_EV is related to the first local I/O line LIO of each local I/O line pair and the signal TM_VC_EVB is related to the second local I/O line LIOB of each local I/O line pair. Also, the signal TM_VC_EV is corresponded to even number of bit line pairs and the signal TM_VC_OD is corresponded to odd number of bit line pairs; and the signal TM_VC_EV is for supplying a logic high level voltage to corresponded bit line and the signal TM_SS_EV is for supplying a logic low level voltage to corresponded bit line.

In addition, though not shown in table 2, there are a lot of cases during the test performed in the semiconductor memory device according to the present invention.

Figure 11:
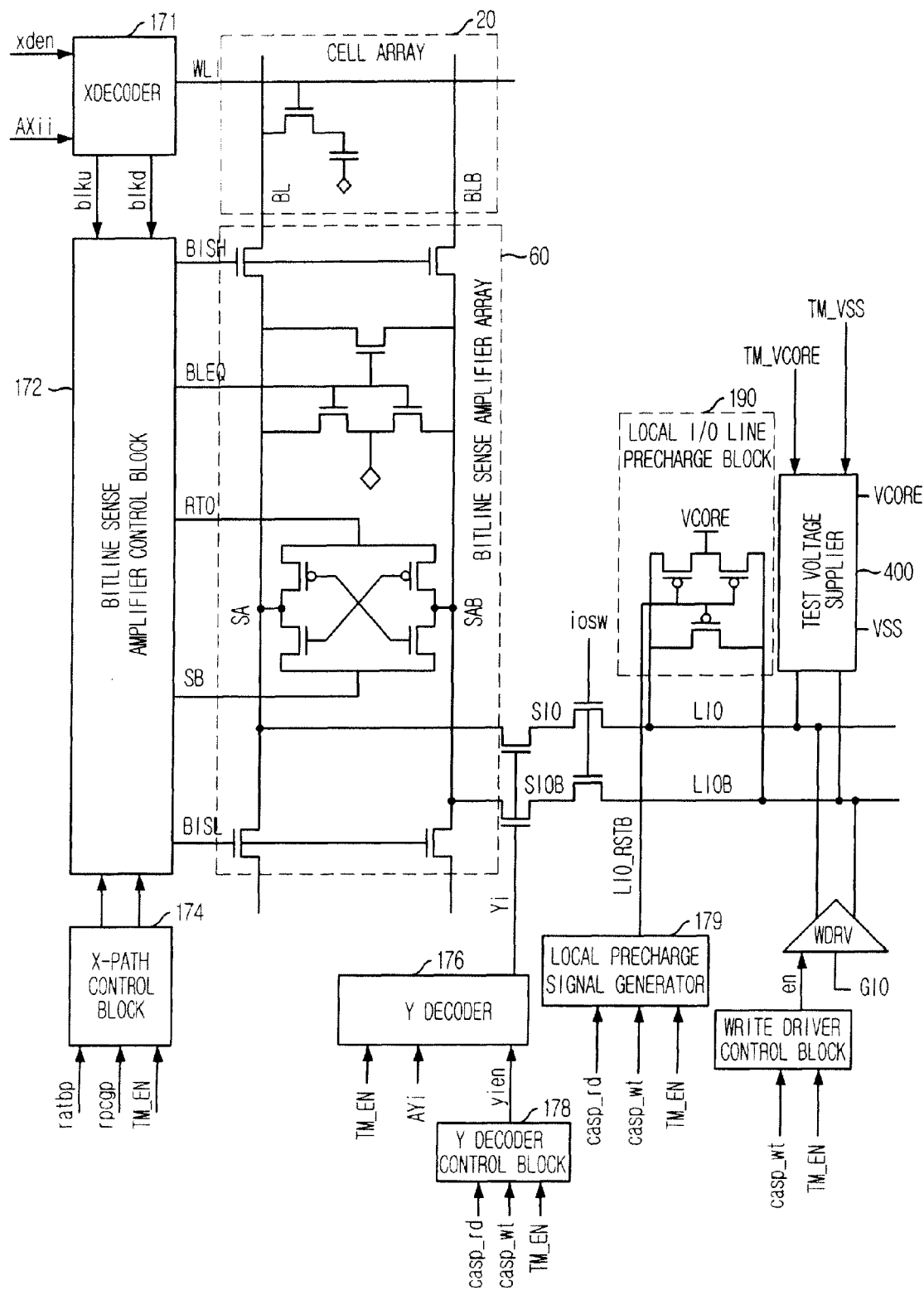
FIG. 11 is a block diagram showing a semiconductor memory device in accordance with a second embodiment of the present invention.

FIG. 11 is a block diagram showing a semiconductor memory device in accordance with a second embodiment of the present invention.

As shown, the semiconductor memory device includes a cell array 20, a bit line sense amplifier array 60, a bit line sense amplifier control block 172, an X decoder 171, an Y decoder 176, a X-path control block 174, a Y decoder control block 178, a local I/O line precharge block 190, a local precharge signal generator 179, a write driver 200 and a write driver control block 290.

Referring to FIG. 11, the semiconductor memory device is similar to the semiconductor memory device shown in FIG. 4. Thus, a detailed description about above described blocks is omitted herein. However, the semiconductor memory device further includes a test voltage supplier 400 coupled to the local I/O line pair LIO and LIOB.

Herein, the write driver 200 does not generate any predetermined test voltage during the test mode. The write driver 200 is very similar to those in the conventional semiconductor memory device in their functions. During the test mode, the predetermined test voltage is generated from the test voltage supplier. In addition, since two different test voltages can be respectively supplied to the first and the second local I/O lines, a precharge block included in the bit line sense amplifier array 60 is inactivated during the test mode.

Likewise, in the semiconductor memory device shown in FIG. 11, a plurality of bit line pairs, e.g., BL and BLB, are coupled to the segment I/O line pair SIO and SIOB and a plurality of segment I/O lines, e.g., SIO and SIOB are coupled to the local I/O line pair LIO and LIOB, i.e., a first local I/O line and a second local I/O line.

There are two switching blocks: a first one is for connecting or disconnecting the bit line pair to the segment I/O line pair in response to the column control signal Yi and a second one is for connecting or disconnecting the segment I/O line pair to the local I/O line pair in response to a data I/O control signal iosw.

The predetermined test voltage is generated by the test voltage supplier 400 and supplied to the local line pair LIO and LIOB. Then, through the second switching block, the predetermined test voltage is transmitted to the segment I/O line pair SIO and SIOB. After then, through the first switching block, the predetermined test voltage is supplied to the bit line pair BL and BLB in response to the column control signal Yi.

Figure 12:
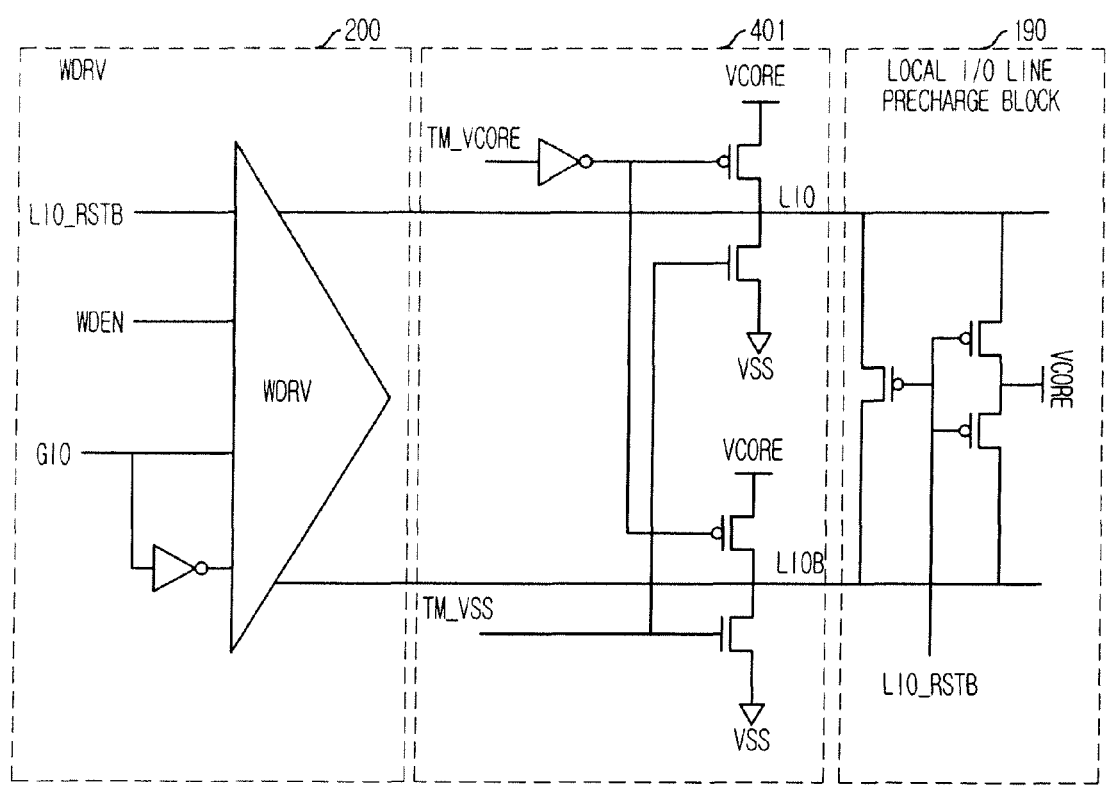
FIG. 12 is a block diagram describing an exemplary embodiment of a test voltage supplying block shown in FIG. 11.

FIG. 12 is a block diagram describing an exemplary embodiment of the test voltage supplying block 400 shown in FIG. 11.

As shown, the write driver 200 and the local I/O line precharge block 190 are described. Further, the test voltage supplier, e.g., 401, is described.

Herein, during the test mode, the test voltage supplier 401 generates the predetermined test voltage in response to a first test voltage control signal TM_VCORE and a second test voltage control signal TM_VSS.

The test voltage supplier 401 includes an inverter for inverting the first test voltage control signal TM_VCORE, a first to a fourth control transistors. The first and the third control transistors coupled to the core voltage VCORE respectively output the core voltage VCORE to the first and the second local I/O lines LIO and LIOB in response to an output signal of the inverter, and the second and the fourth control transistors coupled to the ground VSS respectively output the ground VSS to the first and the second local I/O lines LIO and LIOB in response to the second test voltage control signal TM_VSS.

Figure 13:
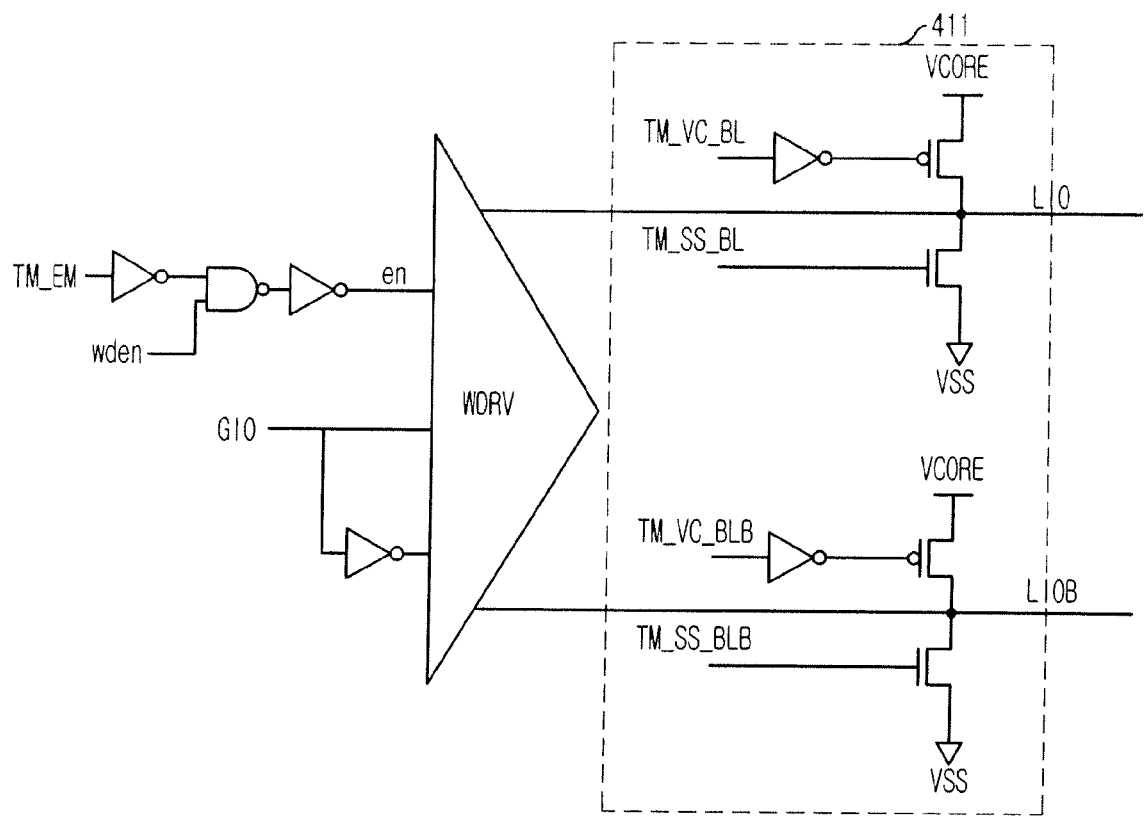
FIG. 13 is a block diagram describing another exemplary embodiment of the test voltage supplying block shown in FIG. 11.

FIG. 13 is a block diagram describing another exemplary embodiment of the test voltage supplying block 400 shown in FIG. 11.

As shown, the test voltage supplier, e.g., 411, the write driver 200 and a partial circuit of the write driver control block 290 are described.

Herein, during the test mode, the test voltage supplier 411 can generate two different predetermined test voltages in response to a first to a fourth test voltage control signals TM_VC_BL, TM_SS_BL, TM_VC_BLB and TM_SS_BLB.

The test voltage supplier 411 includes a first control inverter for inverting the first test voltage control signal TM_VC_BL, a second control inverter for inverting the third test voltage control signal TM_VC_BLB, a first to a fourth control transistors. The first and the third control transistors coupled to the core voltage VCORE respectively output the core voltage VCORE to the first and the second local I/O lines LIO and LIOB in response to output signals of the first and the second control inverters, and the second and the fourth control transistors coupled to the ground VSS respectively output the ground VSS to the first and the second local I/O lines LIO and LIOB in response to the second and the fourth test voltage control signals TM_SS_BL and TM_SS_BLB.

As compared with FIG. 12, the test voltage supplier 411 shown in FIG. 13 can perform a test having more cases by using the first to fourth test voltage control signals TM_VC_BL, TM_SS_BL, TM_VC_BLB and TM_SS_BLB. That is, the test voltage supplier 411 shown in FIG. 13 can supply two different logic level voltages to the first and the second local I/O lines.

Figure 14A:
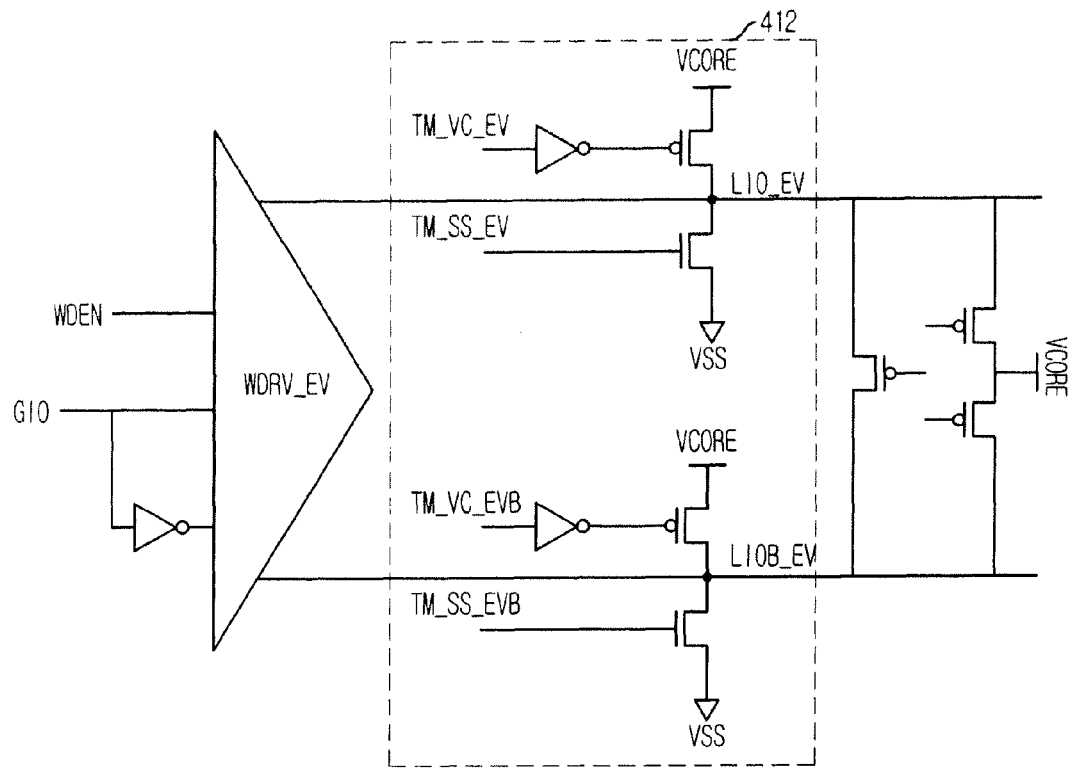
FIGS. 14A and 14B are block diagrams depicting the test voltage supplying block shown in FIG. 13 in response to even and odd local I/O line pairs.
Figure 14B:
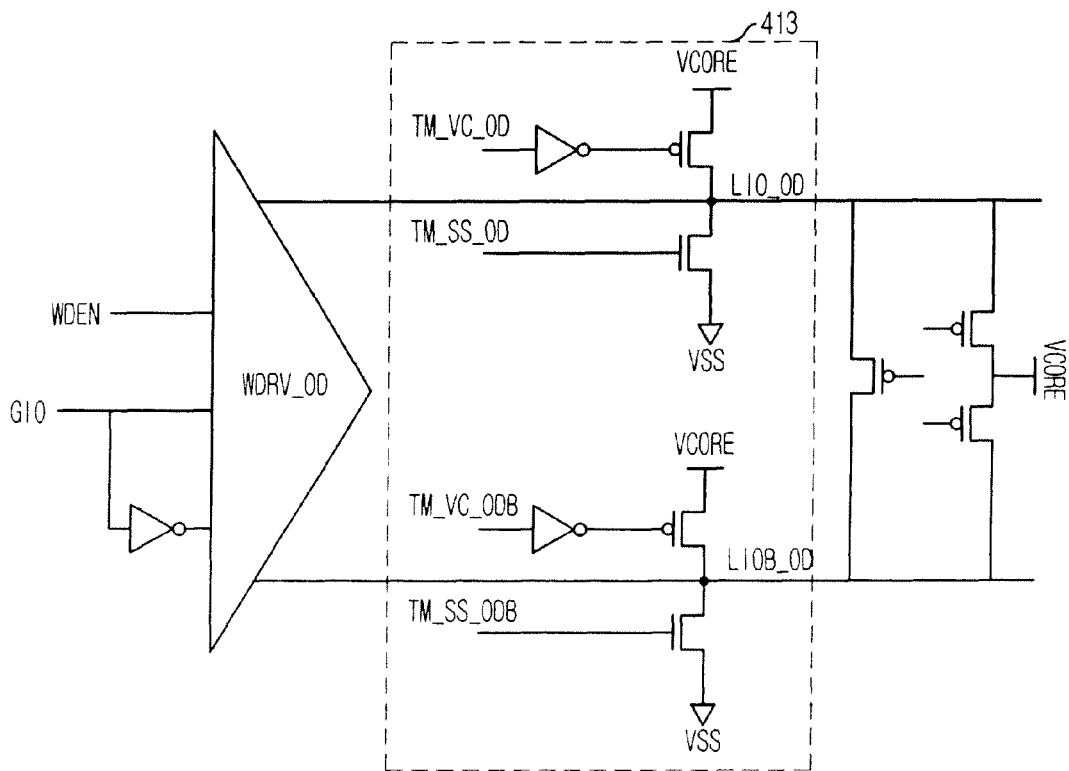

FIGS. 14A and 14B are block diagrams depicting exemplary circuits of the test voltage supplying block 411 shown in FIG. 13 in response to even and odd number local I/O line pairs.

As shown, an even number test voltage supplying block, e.g., 412, and an odd number test voltage supplying block, e.g., 413, are the same to the test voltage supplying block 411 shown in FIG. 13 in their structures.

However, the semiconductor memory device including the even number test voltage supplying block 412 and the odd number test voltage supplying block 413 can perform a test having more cases in response to eight number of test voltage control signals.

As above described, the signal TM_VC_EV is related to a first even local I/O line LIO_EV of each even local I/O line pair and the signal TM_VC_EVB is related to a second even local I/O line LIOB_EV of each even local I/O line pair. Also, as the signal TM_VC_EV is corresponded to even number of bit line pairs, the signal TM_VC_OD is corresponded to odd number of bit line pairs, more particularly, a first odd local I/O line LIO_OD of each odd local I/O line pair and the signal TM_VC_ODB is corresponded to a second odd local I/O line LIOB_OD of each odd local I/O line pair.

Furthermore, the signals TM_VC_EV and TM_VC_OD are for supplying a logic high level voltage to each first local I/O line of the even and odd local I/O lines and the signals TM_SS_EV and TM_SS_OD are for supplying a logic low level voltage to each first local I/O line of the even and odd local I/O lines. Likewise, the signals TM_SS_EVB and TM_SS_ODB are for supplying a logic low level voltage to each second local I/O line of the even and odd local I/O lines.

Herein, plural test voltage control signals, e.g., TM_VC_OD, can be generated by the second test decision block described in FIGS. 10A to 10D.

Figure 15:
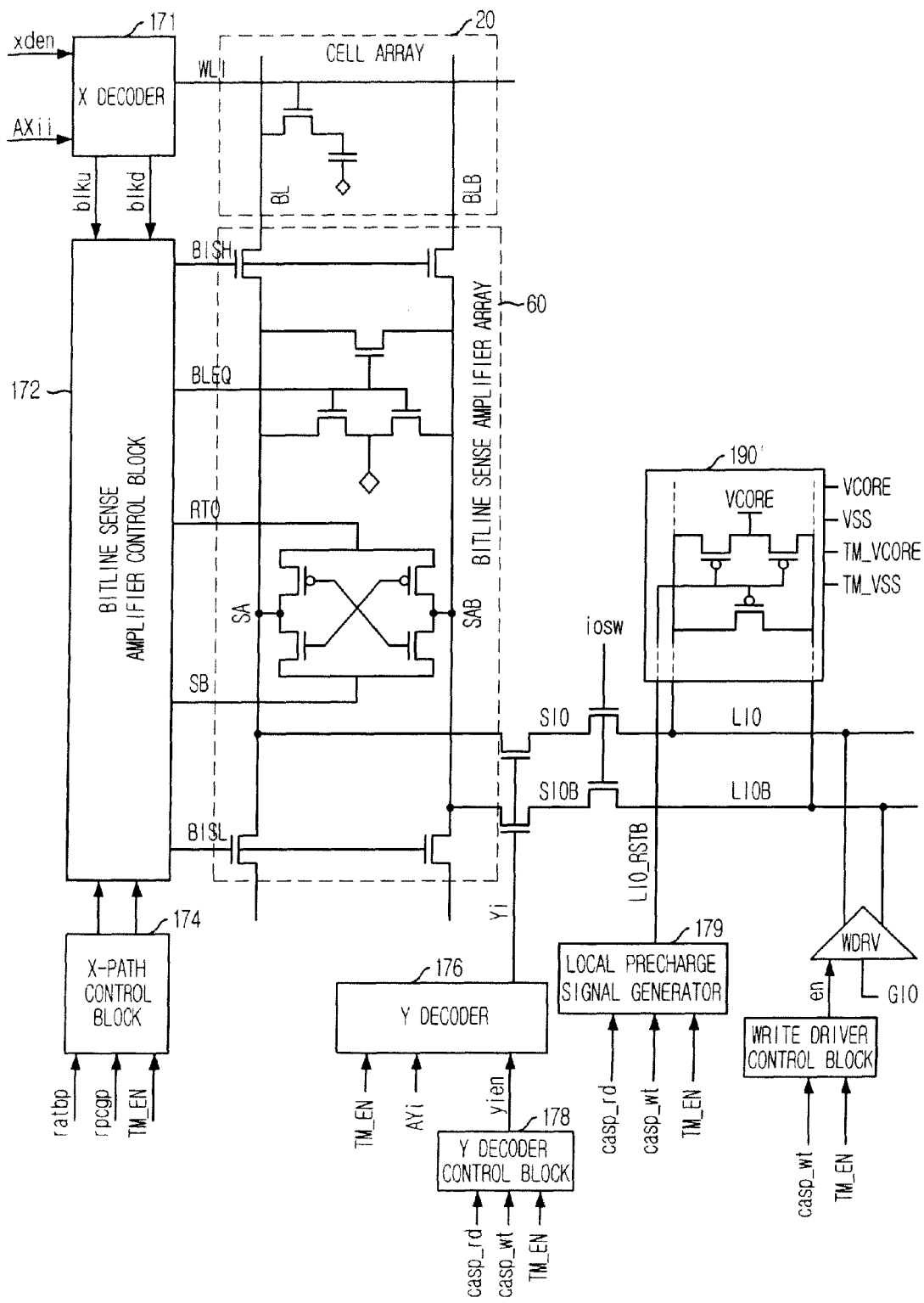
FIG. 15 is a block diagram showing a semiconductor memory device in accordance with a third embodiment of the present invention.

FIG. 15 is a block diagram showing a semiconductor memory device in accordance with a third embodiment of the present invention.

As shown, the semiconductor memory device includes a cell array 20, a bit line sense amplifier array 60, a bit line sense amplifier control block 172, an X decoder 171, an Y decoder 176, an X-path control block 174, an Y decoder control block 178, a local I/O line precharge block 190', a local precharge signal generator 179, a write driver 200 and a write driver control block 290.

Referring to FIG. 11, the semiconductor memory device is similar to the semiconductor memory device shown in FIG. 4 except for the local I/O line precharge block 190'. Thus, a detailed description about above described blocks is omitted herein.

As compared with FIGS. 4 and 11, the semiconductor memory device does not includes the test voltage supplier 400 for generating a predetermined test voltage during the test mode or the write driver 200 for generating a predetermined test voltage during the test mode and transmitting an inputted data to each local I/O line during the normal mode. However, the local I/O line precharge block 190' can output a predetermined test voltage to each local I/O line pair LIO and LIOB.

Further, the local I/O line precharge block 190' receives a first test mode signal TM_VCORE and a second test mode signal TM_VSS to thereby generate a predetermined test voltage to the local I/O line pair LIO and LIOB during the test mode.

Likewise, in the semiconductor memory device shown in FIG. 15, a plurality of bit line pairs, e.g., BL and BLB, are coupled to the segment I/O line pair SIO and SIOB and a plurality of segment I/O lines, e.g., SIO and SIOB are coupled to the local I/O line pair LIO and LIOB, i.e., a first local I/O line and a second local I/O line.

There are two switching blocks: a first one is for connecting or disconnecting the bit line pair to the segment I/O line pair in response to the column control signal Yi and a second one is for connecting or disconnecting the segment I/O line pair to the local I/O line pair in response to a data I/O control signal iosw.

The predetermined test voltage is generated by the local I/O line precharge block 190' and supplied to the local line pair LIO and LIOB. Then, through the second switching block, the predetermined test voltage is transmitted to the segment I/O line pair SIO and SIOB. After then, through the first switching block, the predetermined test voltage is supplied to the bit line pair BL and BLB in response to the column control signal Yi.

Figure 16:
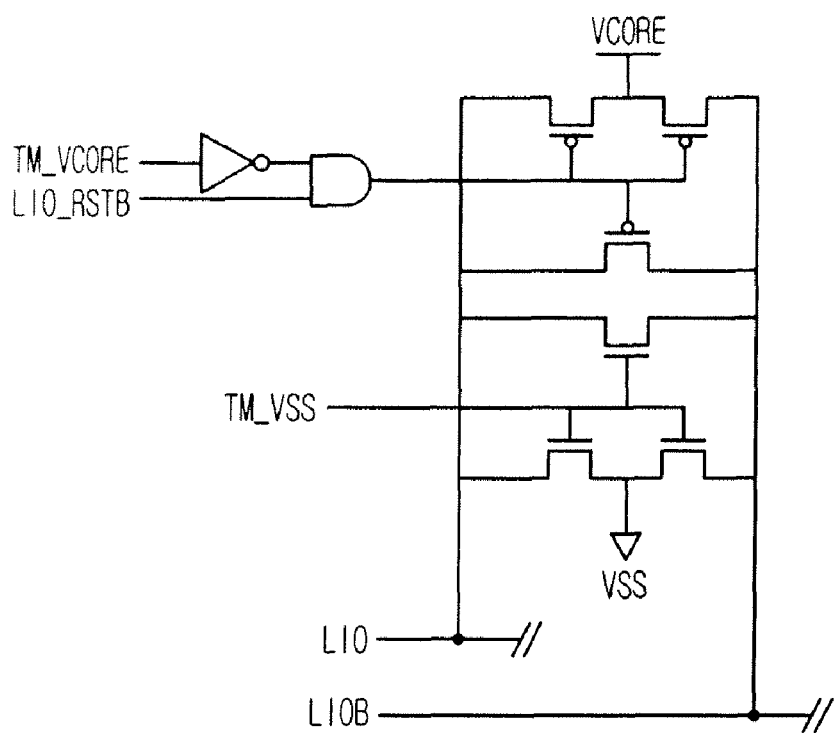
FIG. 16 is a circuit diagram describing a local I/O line precharge block shown in FIG. 15.

FIG. 16 is a circuit diagram describing the local I/O line precharge block 190' shown in FIG. 15.

As shown, the local I/O line precharge block 190' includes an inverter, a logic NOR gate, six transistors.

In the conventional semiconductor memory device, the local I/O line precharge block includes first to third transistors, each controlled by the precharge command signal LIO_RSTB. Then, in response to the precharge command signal LIO_RSTB, the local I/O line precharge block precharges the core voltage VCORE to the first and the second local I/O lines LIO and LIOB.

However, in the present invention, the local I/O line precharge block 190' outputs one of the core voltage VCORE and the ground VSS to the first and the second local I/O lines LIO and LIOB. In detail, if the signal TM_VCORE is activated, the local I/O line precharge block 190' supplies the core voltage VCORE, i.e., a logic high level signal, to the first and the second local I/O lines LIO and LIOB; and, if the signal TM_VSS is activated, the local I/O line precharge block 190' supplies the ground VSS, i.e., a logic low level signal, to the first and the second local I/O lines LIO and LIOB.

In the other hands, since the local I/O line precharge block 190' generates a predetermined test voltage for performing the background test of the semiconductor memory device, it is not possible to supply two different test voltages to the first and the second local I/O lines during the test mode. That is, the background test of the semiconductor memory device shown in FIGS. 15 and 16 can be carried out in a basis of even and odd number bit line pairs, not a basis of a first and a second bit lines of each bit line pair.

As above described, a method for performing a background write test in the semiconductor memory device according to the present invention includes the steps of S10 generating at least one test command signal, S20 preparing a test path for transmitting an predetermined test voltage outputted in response to the test command signal into a unit cell, S40 supplying the predetermined test voltage to a local I/O line pair, and S60 reading a stored data of the unit cell in order to conform a result of the background write test.

Further, in the step S10, at least one test command signal is outputted from the test decision block in response to a test mode enable signal. Also, the test decision block includes plural test command signal sets, e.g., two test mode signals, four test mode signals and eight test voltage control signals, each outputted according to a goal and a range of the background write test.

In the semiconductor memory device according to the present invention, a plurality of bit line pairs, e.g., BL and BLB, are coupled to the segment I/O line pair SIO and SIOB and a plurality of segment I/O lines, e.g., SIO and SIOB are coupled to the local I/O line pair LIO and LIOB, i.e., a first local I/O line and a second local I/O line.

There are two switching blocks: a first one is for connecting or disconnecting the bit line pair to the segment I/O line pair in response to the column control signal Yi and a second one is for connecting or disconnecting the segment I/O line pair to the local I/O line pair in response to a data I/O control signal iosw.

The predetermined test voltage is generated by the write driver 200', the test voltage supplier 400 or the local I/O line precharge block 190' and supplied to the local line pair LIO and LIOB. Then, through the second switching block, the predetermined test voltage is transmitted to the segment I/O line pair SIO and SIOB. After then, through the first switching block, the predetermined test voltage is supplied to the bit line pair BL and BLB in response to the column control signal Yi.

Lastly, in the step S60, the predetermined test voltage inputted through a prepared data path is checked by sensing a data stored in the unit cell corresponding to the prepared data path. If the data is not matched to the predetermined test voltage, the semiconductor memory device has an error. Namely, it means that the semiconductor memory device has a defective unit cell or a fault data path between each unit cell and the local I/O line pair.

Herein, referring to tables 2 to 4, plural cases of the test performed in the semiconductor memory device are more described.

In the present invention, the test can be carried out in a basis of even and odd number bit line pairs, a basis of a first and a second bit lines of each bit line pair or a basis of even and odd number bit line pairs and a first and a second bit lines of each bit line pairs. According to the test, the number of test control signals is different.

In the tables 2 to 4, representative cases of the background test are described. At maximum, the background test has 16 cases, but some of 16 cases, are not used frequently during the background test. For example, the case that three among four bit lines, i.e., an even bit line, an even bit line bar, an odd bit line and an odd bit line bar have the same logic value, e.g., H, H, H and L, is unusual.

For achieving the plural cases, the semiconductor memory device can receive two, four or nine test control signals. If the semiconductor memory device includes a test decision block described in FIGS. 8A and 8B or FIGS. 10A to 10D, the semiconductor memory device can perform the background test by using at minimum number of the test control signals.

Further, in above described semiconductor memory device, the predetermined test voltage is supplied to the local I/O line pair. However, the predetermined test voltage can be supplied to others according to goal of the background test.

In the present invention, although made by a simplified manufacturing method and a moderate manufacturing cost, a semiconductor memory device can perform various reliability tests.

In addition, since the semiconductor memory device having additional modules and wires in its peripheral area in order to perform a reliability test, a manufacturing step or coat of the semiconductor memory device can be reduced.

Further, the semiconductor memory device can perform the background test for a reliability test in various patterns, more particularly, by supplying different test voltages to first and second bit lines consisting of a bit line pair during the background test.

The present application contains subject matter related to Korean patent application No. 2004-59668, filed in the Korean Patent Office on Jul. 29, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A method for performing a background write test in the semiconductor memory device, comprising the steps of:
   a) generating at least one test command signal;
   b) preparing a test path for transmitting a predetermined test voltage outputted from an external circuit to a unit cell in response to the test command signal generated at the step a) by activating a word line for performing a test operation and by coupling a local input/output (I/O) line pair to a bit line for performing the test operation;
   c) supplying the predetermined test voltage to the local I/O line pair; and
   d) reading stored data of the unit cell in order to compare the predetermined test voltage with the stored data of the unit cell corresponding to the test path.

2. The method as recited in claim 1, wherein, in the step a), at least one test command signal is outputted from a test decision block in response to a test mode enable signal inputted from an external circuit.

3. The method as recited in claim 1, wherein the test decision block outputs one of two test mode signal set, four test mode signal set and eight test voltage control signal set according to a goal and a range of the background write test.

4. A semiconductor memory device for performing a background test, comprising:
   a test decision block configured to determine a goal and a range of the background write test and to generate at least one test control signal;
   a test voltage generating block configured to output at least one predetermined test voltage to each data line in response to the test control signal outputted from the test decision block, wherein the test voltage generating block activates a word line for performing a test operation and couples a local input/output (I/O) line pair to a bit line for performing the test operation; and
   a test performing block, coupled to the test voltage generating block through each data line, configured to receive the predetermined test voltage and to compare the predetermined test voltage of each data line with stored data at each unit cell.

5. The semiconductor memory device as recited in claim 4, wherein the test decision block is enabled by a test mode enable signal inputted from an output side of the semiconductor memory device.

6. The semiconductor memory device as recited in claim 5, wherein the test decision block outputs one of two test mode signal set, four test mode signal set and eight test voltage control signal set according to the goal and the range of the background write test.

7. The semiconductor memory device as recited in claim 6, wherein the background test is carried out in one of a basis of even and odd number bit line pairs, a basis of a first and a second bit lines of each bit line pair and a basis of even and odd number bit line pairs and a first and a second bit lines of each bit line pairs according to the goal and the range of the background write test.

8. The semiconductor memory device as recited in claim 7, wherein a write driver for transmitting a data inputted from the outside of the semiconductor memory device into the local I/O line pair during a data access operation is served as the test voltage generating block during a test mode.

9. The semiconductor memory device as recited in claim 8, wherein the write driver includes:
a data receiving block for receiving the inputted data signal, a precharge command signal and a write enable signal and generating first and second output signals;
a latching block for receiving and latching the first and second output signals respectively to output an inverse first output signal and an inverse second output signal; and
the test voltage generating block for receiving the inverse first output signal, the inverse second output signal and first and second test mode signals to thereby output one of the inputted data signal and the predetermined test voltage to each local I/O line pair in response to the first and second test mode signals.

10. The semiconductor memory device as recited in claim 8, wherein the write driver includes:
a data receiving block for receiving the inputted data signal, a precharge command signal and a write enable signal and generating first and second output signals;
a latching block for receiving and latching the first and second output signals respectively to output an inverse first output signal and an inverse second output signal; and
a voltage generating block for receiving the inverse first output signal, the inverse second output signal, a first test mode signal, a second test mode signal, a third test mode signal and a fourth test mode signal to thereby output one of the inputted data signal and the predetermined test voltage to each local I/O line pair in response to the first to fourth test mode signals.

11. The semiconductor memory device as recited in claim 7, wherein a local I/O line precharging block for generating a core voltage as a local I/O line precharge voltage during a normal mode is served as the test voltage generating block during a test mode.

12. The semiconductor memory device as recited in claim 11, wherein the local I/O line precharging block includes:
a precharging block for precharging the local I/O line pair as the core voltage during the normal mode and outputting a logic high level voltage to the local I/O line pair in response to a first test control signal during the test mode;
a ground supplying block for outputting a logic low level voltage to the local I/O line pair in response to a second test control signal during the test mode; and
a control block for receiving a precharge command signal and the first test control signal to thereby control the precharging block during the normal mode and the test mode.

13. The semiconductor memory device as recited in claim 4, wherein the test performing block includes:
a cell array having a plurality of unit cells, each for storing an inputted data;
a sense amplifying block for sensing and amplifying a data stored in the cell array; and
a bit line pair for delivering the data between the cell array and the sense amplifying block.

14. The semiconductor memory device as recited in claim 13, wherein the data path include:
a segment I/O line pair, each having first and second segment I/O lines and each coupled to each bit line pair;
a first switching block for connecting or disconnecting each bit line pair to each segment I/O line pair in response to a first control signal;
a local I/O line pair, each having first and second local I/O lines and each coupled to each segment I/O pair; and
a second switching block for connecting or disconnecting each segment I/O line pair to each local I/O line pair in response to a second control signal,
wherein the first and second control signals are respectively corresponded to an address and a command signal inputted from the outside of the semiconductor memory device.

15. The semiconductor memory device as recited in claim 14, wherein the data line is the local I/O line pair.

16. The semiconductor memory device as recited in claim 14, wherein the data line is the segment I/O line pair.

* * * * *